(12) United States Patent
Lin et al.

(10) Patent No.: US 9,754,870 B2
(45) Date of Patent: *Sep. 5, 2017

(54) COMPOUND CARRIER BOARD STRUCTURE OF FLIP-CHIP CHIP-SCALE PACKAGE AND MANUFACTURING METHOD THEREOF

(71) Applicant: KINSUS INTERCONNECT TECHNOLOGY CORP., Taoyuan County (TW)

(72) Inventors: Ting-Hao Lin, Taoyuan County (TW); Yi-Fan Kao, Taoyuan County (TW); Shuo-Hsun Chang, Taoyuan County (TW); Yu-Te Lu, Taoyuan County (TW); Kuo-Chun Huang, Taoyuan County (TW)

(73) Assignee: KINSUS INTERCONNECT TECHNOLOGY CORP., Shin-Wu Shiang Taoyuan County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/071,368

(22) Filed: Mar. 16, 2016

(65) Prior Publication Data
US 2016/0197033 A1    Jul. 7, 2016

Related U.S. Application Data

(63) Continuation-in-part of application No. 13/938,335, filed on Jul. 10, 2013, now Pat. No. 9,406,641.

(51) Int. Cl.
*H01L 23/498* (2006.01)
*H01L 23/31* (2006.01)
(Continued)

(52) U.S. Cl.
CPC .... *H01L 23/49838* (2013.01); *H01L 23/3128* (2013.01); *H01L 23/49833* (2013.01); *H05K 3/4697* (2013.01); *H01L 23/49811* (2013.01); *H01L 23/49816* (2013.01); *H01L 23/49827* (2013.01); *H01L 23/562* (2013.01); *H01L 24/16* (2013.01); *H01L 25/105* (2013.01); *H01L 2224/16227* (2013.01); *H01L 2224/73204* (2013.01); *H01L 2224/81191* (2013.01); *H01L 2225/107* (2013.01);
(Continued)

(58) Field of Classification Search
USPC .......................................... 174/258
See application file for complete search history.

(56) References Cited

U.S. PATENT DOCUMENTS

| 5,835,355 A * | 11/1998 | Dordi ..................... H01L 21/563 174/252 |
| 6,396,136 B2 * | 5/2002 | Kalidas ............. H01L 23/49816 257/691 |

(Continued)

*Primary Examiner* — William H Mayo, III
*Assistant Examiner* — Krystal Robinson
(74) *Attorney, Agent, or Firm* — Idea Intellectual Limited; Margaret A. Burke; Sam T. Yip (57) ABSTRACT

A compound carrier board structure of Flip-Chip Chip-Scale Package and manufacturing method thereof provides a baseplate with a penetrating rectangular opening bonded to a non-conductive film then a carrier board in order to form a compound carrier board structure. The baseplate is constructed with a low Thermal Expansion Coefficient material.

4 Claims, 7 Drawing Sheets

(51) Int. Cl.
   *H05K 3/46* (2006.01)
   *H01L 23/00* (2006.01)
   *H01L 25/10* (2006.01)
   *H05K 1/02* (2006.01)
   *H05K 1/18* (2006.01)

(52) U.S. Cl.
   CPC ............ *H01L 2225/1023* (2013.01); *H01L 2924/12042* (2013.01); *H01L 2924/1533* (2013.01); *H01L 2924/15311* (2013.01); *H01L 2924/15787* (2013.01); *H01L 2924/18161* (2013.01); *H01L 2924/3511* (2013.01); *H05K 1/0206* (2013.01); *H05K 1/0271* (2013.01); *H05K 1/183* (2013.01); *H05K 2201/10378* (2013.01); *H05K 2201/10734* (2013.01); *H05K 2203/061* (2013.01)

(56) References Cited

U.S. PATENT DOCUMENTS

| | | | |
|---|---|---|---|
| 7,894,203 B2* | 2/2011 | Kariya | H01L 23/49827 361/763 |
| 7,984,203 B2* | 7/2011 | Madukkarumukumana | G06F 12/1081 710/22 |
| 9,406,641 B2* | 8/2016 | Lin | H01L 24/81 |
| 2003/0100212 A1* | 5/2003 | Kung | H05K 3/4038 439/330 |

* cited by examiner

COMPOUND CARRIER BOARD STRUCTURE OF FLIP-CHIP CHIP-SCALE PACKAGE AND MANUFACTURING METHOD THEREOF

This patent application is a continuation-in-part of Ser. No. 13/938,335 filed on Jul. 10, 2013, currently pending.

BACKGROUND OF THE INVENTION

Field of the Invention

The invention relates to a compound carrier board structure of Flip-Chip Chip-Scale Package, particularly to a compound carrier board structure for enhancing mechanical strength and heat dissipation.

Description of the Related Art

There are two conventional methods for manufacturing Flip-Chip Chip-Scale Package as shown in FIGS. 1A to 1D and 2A to 2D. The Flip-Chip Chip-Scale Package, a three dimension package technology strides toward high-power, high-density and lightweight miniaturized to meet the demand for communication products. Basically, the manufacturing method can be divided into two stages, carrier board stage and package stage. When a die is formed to be a package structure after the two stages, the package structure can be a main structure of a package-on-package, up or down connecting to other package structure or printed circuit boards.

Figure 1A:
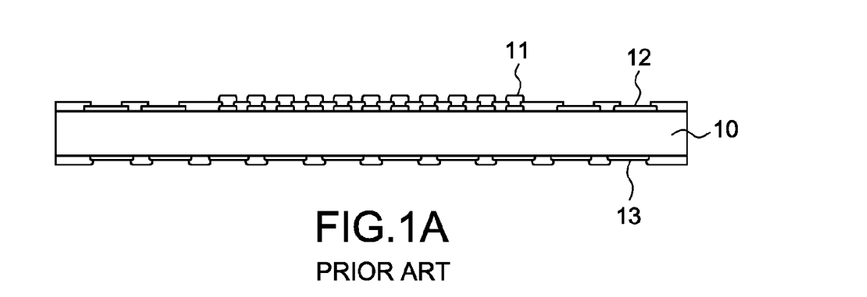
FIG. 1A is a schematic view of a conventional carrier board.
Figure 1B:
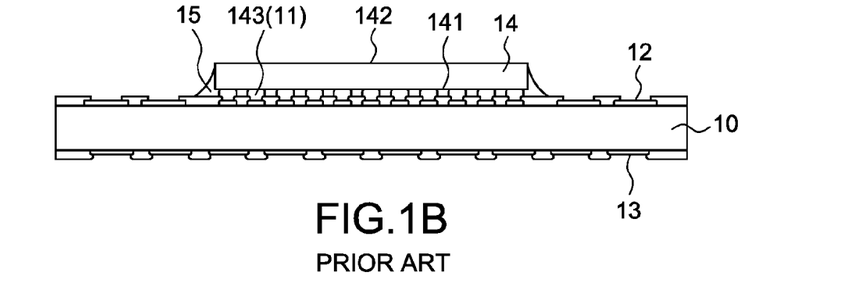
FIG. 1B is a schematic view of a conventional mounted die.
Figure 1C:
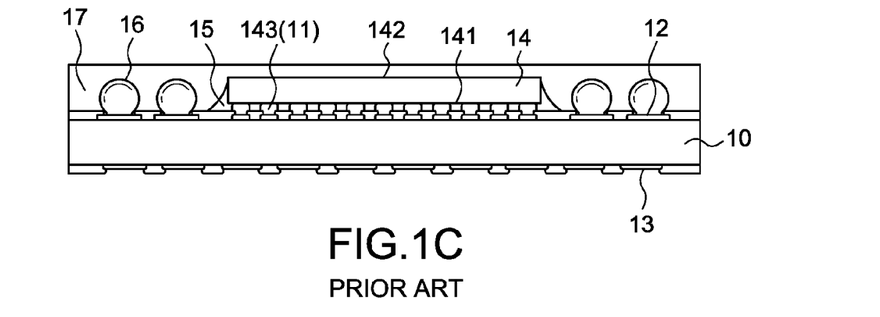
FIG. 1C is a schematic view of a conventional package molding.
Figure 1D:
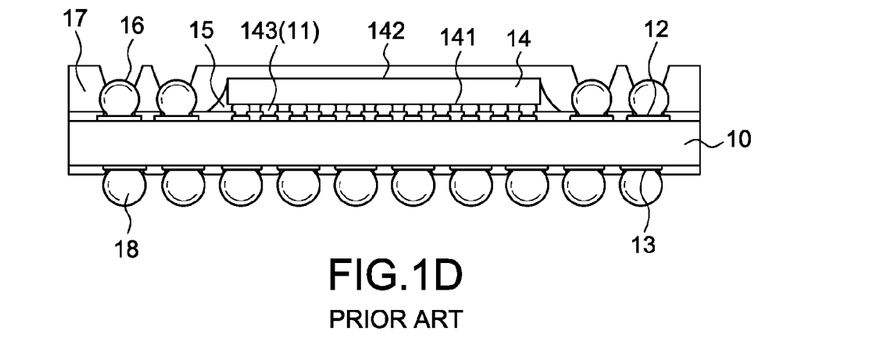
FIG. 1D is a schematic view of a conventional laser Through Mold Via.

With the referenced to FIGS. 1A to 1D, the package stage of the Flip-Chip Chip-Scale Package includes the steps below:

a) providing a carrier board 10 larger or equaling to 150 um having a plurality of first and second contact points 11, 12 at an upper surface thereof and a third contact point 13 at a lower surface thereof; having the second contact point 12 located around the first contact points 11 and planting a first ball 16 at the second contact point 12;

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10; removing the flux after finishing reflowing and utilizing capillary to underfill a primer 15 between the die 14 and the carrier board 10;

c) providing a first ball 16 mounted to the second contact point 12; over laying the first ball 16 and the die 14 by a package molding material 17 for package molding;

d) providing a second ball 18 mounted to the third contact point 13 and conducting Through Mild Via at a predetermined position of the package molding material 17 by laser for presenting an exposed state at a top of the first ball 16.

Figure 2A:
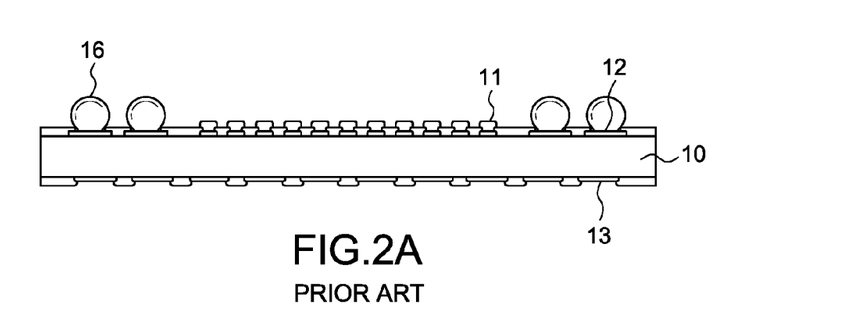
FIG. 2A is a schematic view of a conventional carrier board with ball-planting in advance.
Figure 2B:
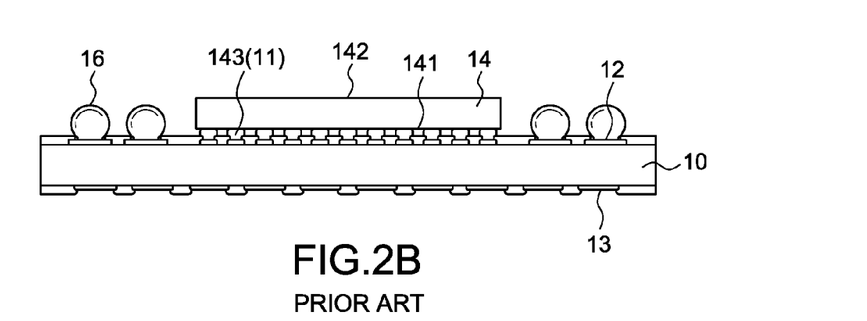
FIG. 2B is a schematic view of a conventional mounted die.
Figure 2C:
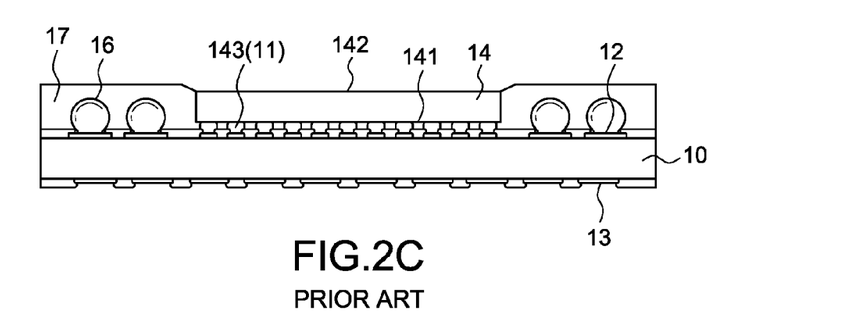
FIG. 2C is a schematic view of a conventional package molding.
Figure 2D:
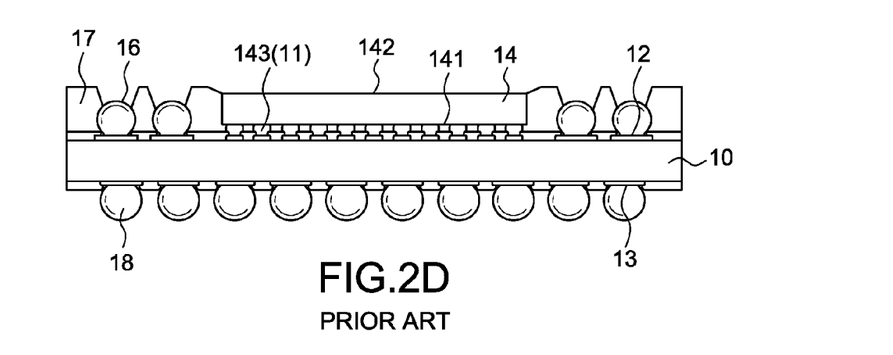
FIG. 2D is a schematic view of a conventional laser Through Mold Via.

With the referenced to FIGS. 2A to 2D, the package stage of the Flip-Chip Chip-Scale Package includes the steps below:

a) providing a carrier board 10 larger or equaling to 150 um having a plurality of first and second contact points 11, 12 at an upper surface thereof and a third contact point 13 at a lower surface thereof; having the second contact point 12 located around the first contact points 11 and planting a first ball 16 at the second contact point 12;

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10 and removing the flux after finishing reflowing;

c) providing package molding material 17 over laying the first ball 16 and bonding to both sides of the die 14 and between the die 14 and the carrier board 10 to present an exposed state at an upper surface of the die 14 for package molding;

d) providing a second ball 18 mounted to the third contact point 13 and conducting Through Mild Via at a predetermined position of the package molding material 17 by laser for presenting an exposed state at a top of the first ball 16.

The above two manufacturing methods of the Flip-Chip Chip-Scale Package use the Through Mild Via structure as the mainstream of the Flip-Chip Chip-Scale Package products. Due to the supporting action while reflowing and the warpage problems of the carrier board 10, the core thickness of the carrier board 10 requires more than 150 um, resulting in the fact that the total thickness of the carrier board 10 cannot be reduced and therefore the Through Mild Via structure formed by the method of the Flip-Chip Chip-Scale Package hinders the total thickness of the package products of the Package-on-Package from continuously declining, being unable to meet future demands of miniaturization. Therefore, there is a still room for improvements.

Also, in U.S. Pat. No. 5,521,435, Mizukoshi disclosed a semiconductor device including a package substrate, a semiconductor chip on the package substrate, a jumper substrate carrying electrodes thereon and conductor patterns that connect the electrodes. The jumper substrate is mounted upon the package substrate to provide an interconnection between the electrode patterns on an upper surface of the package substrate in electrical connection with the electrode pads on the semiconductor chip and the electrodes that are isolated corresponding to a plurality of through-holes arranged on the package substrate. The semiconductor device further has an opening filled with resin to encapsulate the semiconductor chip.

SUMMARY OF THE INVENTION

It is a primary object of the present invention to provide a compound carrier board structure to enhance the mechanical strength and reduce warpage problems of the carrier board.

It is another object of the present invention to provide a baseplate for strengthening the heat dissipation of the compound carrier board structure in order to reduce warpage problems of the carrier board.

In order to achieve the above objects, the compound carrier board structure of Flip-Chip Chip-Scale Package includes a thin carrier board with a thickness less than 150 um, having a plurality of first and second contact points at an upper surface thereof, the second contact points being located around the first contact points; a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads; a non-conductive film having an upper surface bonded to the lower surface of the baseplate with a fitting shape; the second electrode pads each has a lower surface corresponding to position of each second contact points for electronical connection therewith, and the first contact points being located in the opening, bonding a lower surface of the non-conductive film to the upper surface of the carrier board; at least one die having an active surface and a corresponding non-active surface, the active surface having a plurality of dumps connected to the first contact points; and a sealant material filled in a gap between the surrounding walls of the opening and the die at a height lower than the die to fixedly place the die within the opening and leave the non-active surface exposed.

A manufacturing method of the compound carrier board structure of Flip-Chip Chip-Scale Package includes the following steps:

a) providing a carrier board with a thickness less than 150 um, having a plurality of first and second contact points at an upper surface thereof, the second contact points being located around the first contact points;

b) providing a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads;

c) providing a non-conductive film having an upper surface bonded to the lower surface of the baseplate with a fitting shape; the second electrode pads each has a lower surface corresponding to position of each second contact points for electronical connection therewith, and the first contact points being located in the opening, bonding a lower surface of the non-conductive film to the upper surface of the carrier board;

d) providing at least one die having an active surface and a corresponding non-active surface, the active surface having a plurality of dumps connected to the first contact points; and e) providing a sealant material filled in a gap between the surrounding walls of the opening and the die at a height lower than the die to fixedly place the die within the opening and leave the non-active surface exposed.

In another embodiment, the compound carrier board structure of Flip-Chip Chip-Scale Package includes a thin carrier board with a thickness less than 150 um, having a plurality of first and second contact points at an upper surface thereof, the second contact points being located around the first contact points; a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads; a non-conductive film having an upper surface bonded to the lower surface of the baseplate with a fitting shape; the second electrode pads each has a lower surface corresponding to position of each second contact points for electronical connection therewith, and the first contact points being located in the opening, bonding a lower surface of the non-conductive film to the upper surface of the carrier board; a die having an active surface and a corresponding non-active surface, the active surface having a plurality of dumps connected to the first contact points; and a sealant material filled in a gap between the surrounding walls of the opening and the die at a height lower than the die to fixedly place the die within the opening and leave the non-active surface exposed.

Wherein the baseplate is formed by combination of a first layer and a second layer; and each electrical conductive body has an upper conductor in a blind-hole shape, a middle conductor in a buried-hole shape and a lower conductor in a blind-hole shape; the upper conductors located at the first layer, the lower conductors located at the second layer, and the middle conductors located between the first and second layers.

The present invention provides a baseplate with heat-dissipation function and conduction and lap joint functions through the first and second electrode pads of the electrical conductive body, reducing modeling paste through-hole process. The film region of the baseplate also has heat-dissipation function. The carrier board, non-conductive film baseplate and carrier board together form the compound structure with mechanical strength. When the diet is planted in the film region to conduct the package process, it is difficult to cause the warpage problems of the thin carrier board, achieving thin type and heat strengthening and enhancing the mechanical strength.

DETAILED DESCRIPTION OF THE PREFERRED EMBODIMENT

Referring to FIGS. 3A-3F, a compound carrier board structure of Flip-Chip Chip-Scale Package and manufacturing method thereof in accordance with the present invention is divided into a carrier board process and a package process.

Figure 3A:
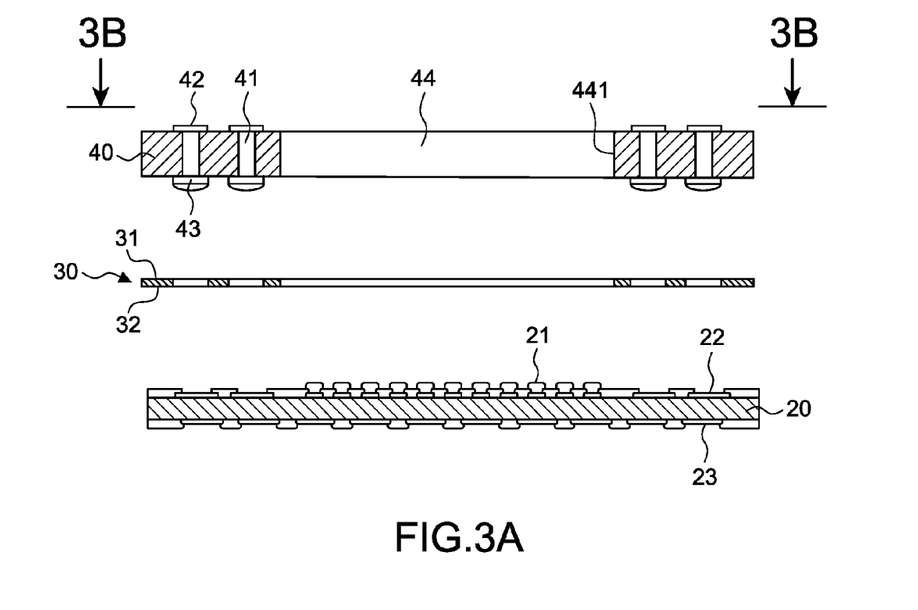
FIG. 3A is a schematic view illustrating a carrier board and a baseplate before combination in accordance with the present invention.
Figure 3B:
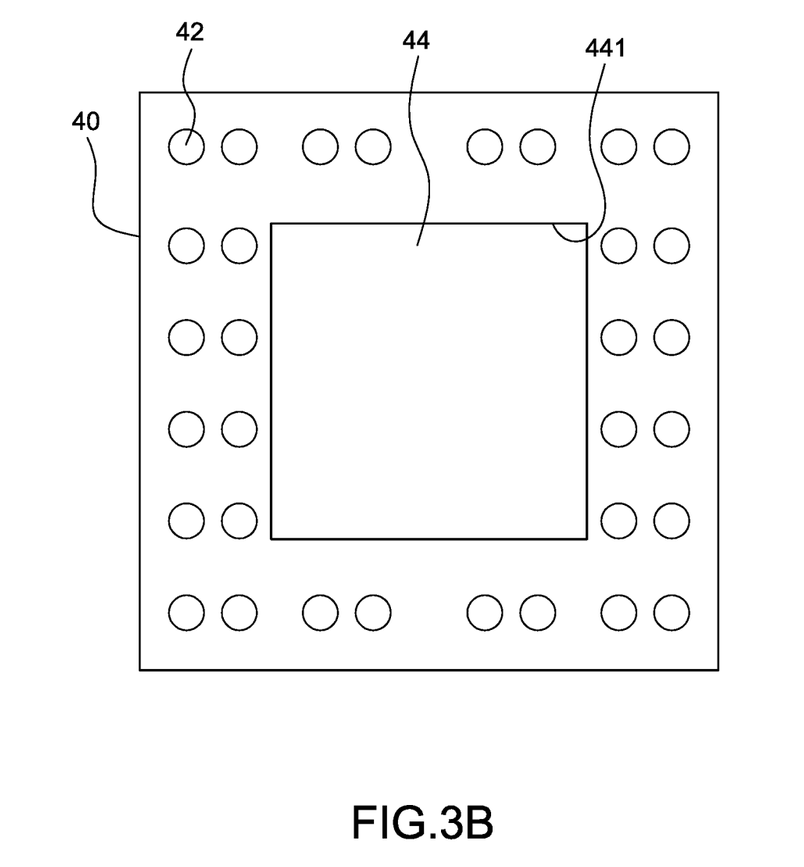
FIG. 3B is a top plan view of the baseplate in FIG. 3A.
Figure 3C:
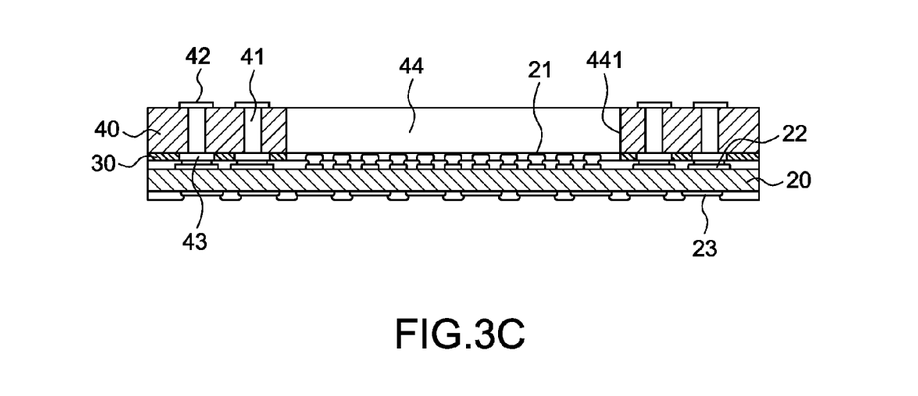
FIG. 3C is a schematic view illustrating a carrier board and a baseplate after combination in accordance with the present invention.

With the referenced FIGS. 3A-3C, a carrier board and a baseplate before and after combination belongs to the carrier board process, including:

a) providing a carrier board 20 with a thickness less than 150 um, having a plurality of first and second contact points 21, 22 at an upper surface thereof, and a plurality of third contact points 23 at an lower surface thereof. The second contact points 22 are located around the first contact points 21.

b) providing a baseplate 40 which is a dot-matrix board, a baseplate with low Coefficient of Thermal Expansion, a carbon composite substrate, or a ceramic substrate. It has a plurality of electrical conductive bodies 41 passing therethrough and a penetrating rectangular opening 44 at the center thereof, forming a plurality of surrounding walls 441. The electrical conductive bodies 41 have upper and lower ends respectively exposed at an upper surface and lower surface of the baseplate 40 and electrically connected to lower surfaces of a plurality of first electrode pads 42 and upper surfaces of a plurality of second electrode pads 43.

c) providing a non-conductive film 30, having an upper surface 31 bonded to the lower surface 45 of the baseplate 40 with a fitting shape. The second electrode pads 43 each has a lower surface corresponding to position of each second contact points 22 for electronical connection therewith, and the first contact points 21 are located in the opening 44, bonding a lower surface 32 of the non-conductive film 30 to the upper surface 24 of the carrier board 20.

Figure 3D:
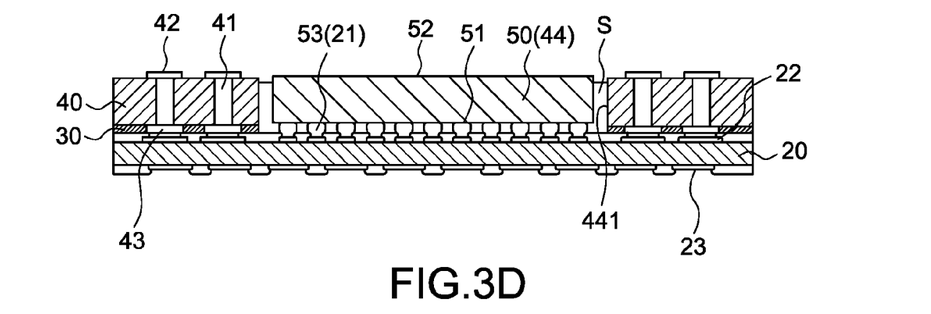
FIG. 3D is a schematic view of the present invention after combining with a die.
Figure 3E:
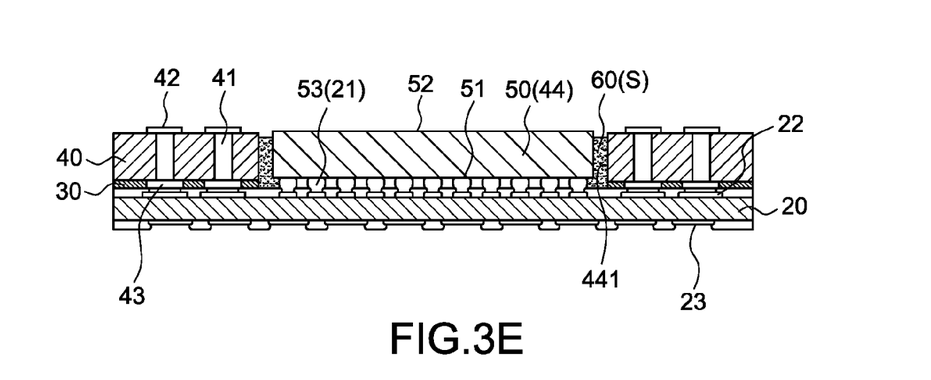
FIG. 3E is a schematic view of package molding in accordance with the present invention.
Figure 3F:
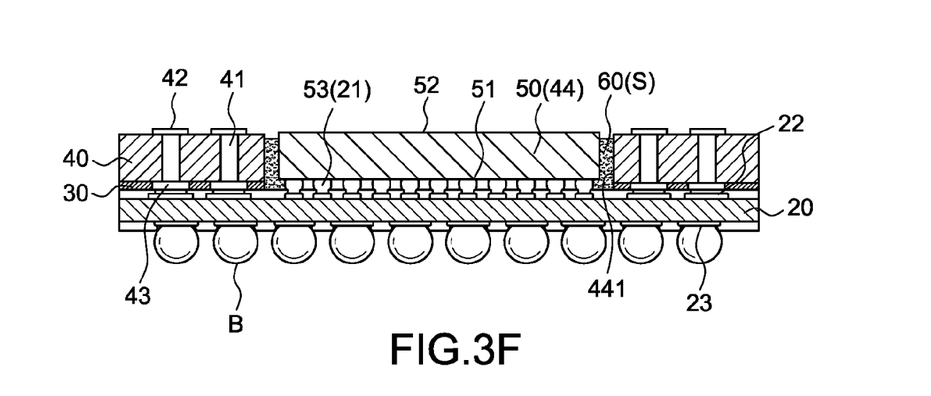
FIG. 3F is a structure schematic view of an applicable embodiment in accordance with the present invention.

With the referenced FIGS. 3D-3F, a package molding and a structure thereof belongs to a package process, including:

d) providing at least one die 50 with an active surface 51 and a corresponding non-active surface 52. The active surface 51 has a plurality of dumps 53 connected to the first contact points 21.

e) providing a sealant material 60 filled in a gap S between the surrounding walls 441 of the opening 44 and the die 50 at a height lower than the die 50 to fixedly place the die 50 within the opening 44 and leave the non-active surface 52 exposed; also, providing a plurality of solder balls B, each bonded to a third contact point 23.

In the embodiment, the compound carrier board structure has a mechanical strength after the carrier board process, including a carrier board 20 having a plurality of first and second contact points 21, 22 at an upper surface thereof and a plurality of third contact points 23 at a lower surface thereof, and the second contact point 22 located around the first contact point 21; and a baseplate 40 having a plurality of electrical conductive bodies 41 passing therethrough and an opening 44, and the electrical conductive bodies 41 having upper and lower ends respectively exposed to an upper surface and lower surface of the baseplate 40 and electrically connected to lower surfaces of a plurality of first electrode pads 42 and upper surfaces of a plurality of second electrode pads 43; a non-conductive film 30 having an upper surface 31 bonded to the lower surface 45 of the baseplate 40. The second electrode pads 43 each has a lower surface corresponding to position of each second contact points 22 for electronical connection therewith, and the first contact points 21 are located in the opening 44, bonding a lower surface 32 of the non-conductive film 30 to the upper surface 24 of the carrier board 20.

In the embodiment, the material of the baseplate 40 is low Coefficient of Thermal Expansion and may be a carbon composite substrate or ceramic substrate for the thin carrier board 20 below 150 um being less susceptible to the thermal stress, leading to warpage problems during the package process. A die 50 implanted into the opening 44 of the compound carrier board structure has corresponding active surface 51 and non-active surface 52. The active surface 51 has a plurality of dumps 53 connected to the first contact point 21 and a sealant material 60 is filled in a gap between the opening 44 and the die 50 for fixing the die 50 to the opening 44 to form an exposed state of the non-active surface 52. Further, a plurality of solder balls B is mounted to the third contact point 23.

Figure 4A:
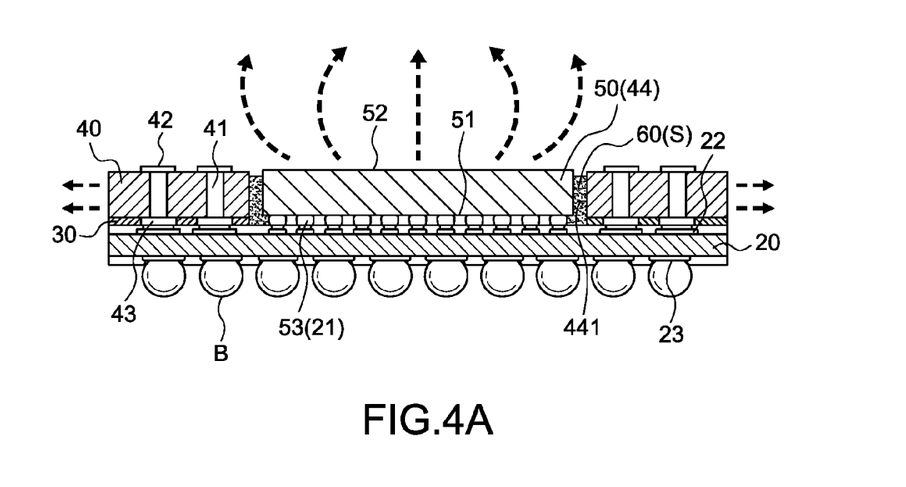
FIG. 4A is a schematic view of the thermal conduction and convention of a packaging die in accordance with the present invention.
Figure 4B:
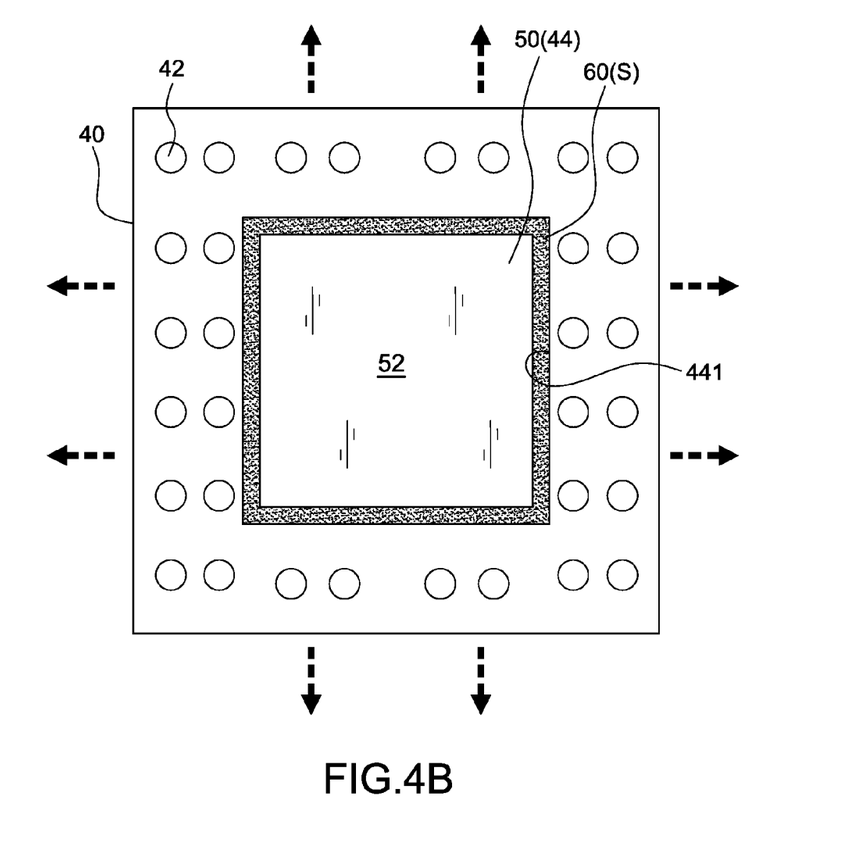
FIG. 4B is a schematic view along line 4B-4B in FIG. 4A.

With reference to FIGS. 4A and 4B, when the die 50 accepts a hot-pressing of the package process, the heat is generated in the opening 44. The baseplate 40 with low Coefficient of Thermal Expansion is able to withstand the thermal stress caused by the thermal conduction to avoid a thermal expansion arising from the thermal convection focused on the carrier board 20 while the baseplate 40, non-conductive film 30 and compound structure strength of carrier board 20 are able to withstand the thermal stress. At the same time, an open area above the opening 44 is able to accelerate the thermal convection. Thus, through the good thermal conduction and convection, the heat generated from the carrier board 20 during the package process can be rapidly eliminated, solving the warpage problems of the carrier board 20 results from the thermal stresses.

In an applicable embodiment, the baseplate 40 may be a dot-matrix board not only providing a single layer but multiple layers by using different materials. Through a drill and laser processing, the baseplate 40 provides shapes of through holes, blind holes, buried holes, semi-through holes and etc. therein and the electrical conductive bodies 41 are filled in the different holes by electroplating method. The electrical conductive body 41 may be a copper structure to present a void-free state and therefore the electrical conductive body 41 may be in a through-hole shape, blind-hole shape, buried-hole shape or semi-through-hole shape to conduct different combinations for the baseplate 40 presenting different structures but it is not a limitation.

Figure 5:
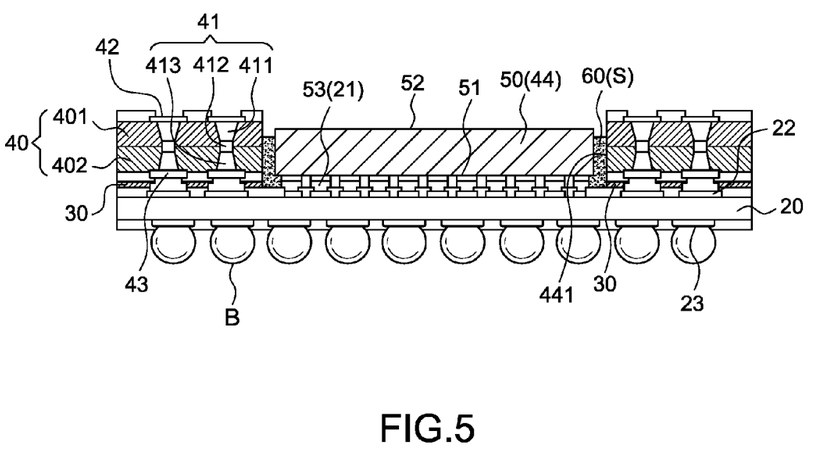
FIG. 5 is a structure schematic view of a first applicable embodiment in accordance with the present invention.

In another applicable embodiment as shown in FIG. 5, the baseplate 40 is formed by combination of a first layer 401 and a second layer 402, and each electrical conductive body 41 has an upper conductor 411 in a blind-hole shape, a middle conductor 412 in a buried-hole shape and a lower conductor 413 in a blind-hole shape. The upper conductors 411 are located at the first layer 401, the lower conductors 413 are located at the second layer 402, and the middle conductors 412 are located between the first and second layers 401, 402.

Based on the features disclosed, the present invention has features described as following.

1. The non-conductive film 30 is combined with the carrier board 20 and the baseplate 40 by the upper and lower surfaces 31, 32 Then the opening 44 has the die 50 fixedly disposed therein by the sealant material 60 filled within the gap S between the surrounding walls 441 and the die 50 to leave the non-active surface 52 exposed, so as to form a compound carrier board structure. Due to the exposed surface, the present invention is able to enhance mechanical strength efficiently than a conventional chip buried in resin within an opening, and to be applied to thin cores less than 150 um to increase layers and coreless carrier boards made by all layer build up method.

2. The present invention has the dot-matrix board as the baseplate 40, using low Thermal Expansion Coefficient material to avoid warpage problems caused by the thermal expansion of the carrier board 20 resulting from the thermal stresses. The carrier board 20 is able to disperse conduction of thermal stresses by the baseplate 40 in order to strengthen cooling effect of the compound carrier board structure.

3. The design of the baseplate 40 not only retains bonding function of Package in Package but also simplify the package process to replace complex Through Mold Via process. In summary, the present invention achieves miniaturization and heat strengthening and enhances the mechanical strength.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A compound carrier board structure of Flip-Chip Chip-Scale Package, comprising:
   a thin carrier board with a thickness less than 150 um, having a plurality of first and second contact points at an upper surface thereof, the second contact points being located around the first contact points;
   a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads;
   a non-conductive film having an upper surface bonded to the lower surface of the baseplate with a fitting shape; the second electrode pads each having a lower surface corresponding to position of each second contact points for electronical connection therewith, and the first contact points being located in the opening, bonding a lower surface of the non-conductive film to the upper surface of the carrier board;
   at least one die having an active surface and a corresponding non-active surface, the active surface having a plurality of dumps connected to the first contact points; and
   a sealant material filled in a gap between the surrounding walls of the opening and the die at a height lower than the die to fixedly place the die within the opening and leave the non-active surface exposed.

2. The compound carrier board structure of Flip-Chip Chip-Scale Package as claimed in claim 1, wherein the electrical conductive bodies are in a through-hole shape.

3. A manufacturing method of the compound carrier board structure of Flip-Chip Chip-Scale Package as claimed in claim 1, comprising:
   a) providing a carrier board with a thickness less than 150 um, having a plurality of first and second contact points at an upper surface thereof, the second contact points being located around the first contact points;
   b) providing a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads;
   c) providing a non-conductive film having an upper surface bonded to the lower surface of the baseplate with a fitting shape; the second electrode pads each has a lower surface corresponding to position of each second contact points for electronical connection therewith, and the first contact points being located in the opening, bonding a lower surface of the non-conductive film to the upper surface of the carrier board;
   d) providing at least one die having an active surface and a corresponding non-active surface, the active surface having a plurality of dumps connected to the first contact points; and
   e) providing a sealant material filled in a gap between the surrounding walls of the opening and the die at a height lower than the die to fixedly place the die within the opening and leave the non-active surface exposed.

4. A compound carrier board structure of Flip-Chip Chip-Scale Package, comprising:
   a thin carrier board with a thickness less than 150 um, having a plurality of first and second contact points at an upper surface thereof, the second contact points being located around the first contact points;
   a baseplate being a dot-matrix board, a baseplate with low Coefficient of Thermal Expansion, a carbon composite substrate, or a ceramic substrate, having a plurality of electrical conductive bodies passing therethrough and a penetrating rectangular opening at the center thereof, forming a plurality of surrounding walls, the electrical conductive bodies having upper and lower ends respectively exposed at an upper surface and lower surface of the baseplate and electrically connected to lower surfaces of a plurality of first electrode pads and upper surfaces of a plurality of second electrode pads;
   a non-conductive film having an upper surface bonded to the lower surface of the baseplate with a fitting shape; the second electrode pads each has a lower surface corresponding to position of each second contact points for electronical connection therewith, and the first contact points being located in the opening, bonding a lower surface of the non-conductive film to the upper surface of the carrier board;
   a die having an active surface and a corresponding non-active surface, the active surface having a plurality of dumps connected to the first contact points; and
   a sealant material filled in a gap between the surrounding walls of the opening and the die at a height lower than the die to fixedly place the die within the opening and leave the non-active surface exposed;
   wherein the baseplate is formed by combination of a first layer and a second layer; and
   wherein each electrical conductive body has an upper conductor in a blind-hole shape, a middle conductor in a buried-hole shape and a lower conductor in a blind-hole shape; the upper conductors located at the first layer, the lower conductors located at the second layer, and the middle conductors located between the first and second layers.

* * * * *